United States Patent
Kaibara et al.

(10) Patent No.: US 8,866,231 B2
(45) Date of Patent: Oct. 21, 2014

(54) NITRIDE SEMICONDUCTOR DEVICE
(71) Applicant: Panasonic Corporation, Osaka (JP)
(72) Inventors: Kazuhiro Kaibara, Osaka (JP); Yoshiharu Anda, Osaka (JP)
(73) Assignee: Panasonic Corporation, Osaka (JP)
( * ) Notice: Subject to any disclaimer, the term of this patent is extended or adjusted under 35 U.S.C. 154(b) by 0 days.
(21) Appl. No.: 14/152,681
(22) Filed: Jan. 10, 2014
(65) Prior Publication Data
US 2014/0124867 A1 May 8, 2014

Related U.S. Application Data
(63) Continuation of application No. PCT/JP2012/003676, filed on Jun. 5, 2012.

(30) Foreign Application Priority Data
Jul. 12, 2011 (JP) .................. 2011-154123

(51) Int. Cl.
*H01L 21/70* (2006.01)
*H01L 29/812* (2006.01)
*H01L 23/522* (2006.01)
*H01L 23/528* (2006.01)
*H01L 29/417* (2006.01)
*H01L 23/482* (2006.01)
*H01L 29/423* (2006.01)
*H01L 29/778* (2006.01)

(52) U.S. Cl.
CPC ............ *H01L 23/528* (2013.01); *H01L 29/812* (2013.01); *H01L 2924/0002* (2013.01); *H01L 23/5226* (2013.01); *H01L 29/7787* (2013.01); *H01L 29/41758* (2013.01); *H01L 23/4824* (2013.01); *H01L 29/42356* (2013.01)
USPC .......................................... 257/368; 257/615

(58) Field of Classification Search
CPC ............ H01L 23/4824; H01L 23/5226; H01L 23/528; H01L 29/41758; H01L 29/812; H01L 29/42356; H01L 29/7787; H01L 2924/0002
USPC ...................................... 257/368, 615, E27.06
See application file for complete search history.

(56) References Cited

U.S. PATENT DOCUMENTS 4,972,237 A    11/1990   Kawai
6,268,632 B1 *  7/2001   Sugimura et al. ............. 257/365

(Continued)

FOREIGN PATENT DOCUMENTS

JP     05-251479 A    9/1993
JP     06-077258 A    3/1994

(Continued)

OTHER PUBLICATIONS

U.S. Appl. No. 14/133,102, Kazuhiro Kaibara, filed Dec. 18, 2013.

(Continued)

*Primary Examiner* — Khiem D Nguyen
(74) *Attorney, Agent, or Firm* — McDermott Will & Emery LLP

(57) ABSTRACT

A nitride semiconductor device includes: first electrode interconnect layers extending in parallel with one another over the nitride semiconductor layer and divided by areas extending across a longitudinal direction of the first electrode interconnect layers; first gate electrodes extending along the first electrode interconnect layers; first gate electrode connecting interconnects extending in associated ones of the areas dividing the first electrode interconnect layers and being in connection to the first gate electrodes; first electrode connecting interconnects formed above the first gate electrode connecting interconnects and being in connection to the first electrode interconnect layers; a first electrode upper interconnects formed on the first electrode connecting interconnects with an interconnect insulating film interposed therebetween, and being in connection to the first electrode connecting interconnects through associated ones of openings of the interconnect insulating film.

12 Claims, 5 Drawing Sheets

(56) References Cited

U.S. PATENT DOCUMENTS

| | | |
|---|---|---|
| 7,550,821 B2 | 6/2009 | Shibata et al. |
| 7,915,645 B2 * | 3/2011 | Briere .................. 257/195 |
| 8,344,463 B2 | 1/2013 | Yanagihara et al. |
| 8,569,843 B2 | 10/2013 | Yanagihara et al. |
| 2005/0189561 A1 | 9/2005 | Kinzer et al. |
| 2005/0189562 A1 | 9/2005 | Kinzer et al. |
| 2008/0149940 A1 | 6/2008 | Shibata et al. |
| 2010/0213503 A1 | 8/2010 | Yanagihara et al. |
| 2010/0320505 A1 * | 12/2010 | Okamoto et al. ............. 257/192 |
| 2013/0119486 A1 | 5/2013 | Kaibara et al. |

FOREIGN PATENT DOCUMENTS

| | | |
|---|---|---|
| JP | 2000-049169 A | 2/2000 |
| JP | 2008-177527 A | 7/2008 |
| JP | 2010-080877 A | 4/2010 |
| WO | 85-02061 A1 | 5/1985 |
| WO | 85-02601 A1 | 6/1985 |

OTHER PUBLICATIONS

Ando et al., "Characterization of High Breakdown Voltage AlGaN/GaN Heterojunction FETs with a Field Plate Gate," Technical Report of IEICE, ED2002-214, CPM2002-105 (Oct. 2002), with partial translation, pp. 29-34.

International Search Report issued in International Application No. PCT/JP2012/003676 mailed Sep. 11, 2012, with partial translation, 5 pgs.

Notice of Allowance issued in U.S. Appl. No. 13/733,827 with Date Mailed Feb. 24, 2014.

* cited by examiner

NITRIDE SEMICONDUCTOR DEVICE

CROSS-REFERENCE TO RELATED APPLICATIONS

This is a continuation of International Application No. PCT/JP2012/003676 filed on Jun. 5, 2012, which claims priority to Japanese Patent Application No. 2011-154123 filed on Jul. 12, 2011. The entire disclosures of these applications are incorporated by reference herein.

BACKGROUND

The present disclosure relates to nitride semiconductor devices, and more particularly, to nitride semiconductor devices including electrode pads above an active region.

Group III-V nitride semiconductors which are represented by the general formula: $Al_xGa_{1-x-y}In_yN$, where $0 \le x \le 1$, $0 \le y \le 1$, and $0 \le x+y \le 1$, have a wide band gap and a direct transition band structure as their physical characteristics, and thus are applied to short-wavelength optical devices. Further, application of the group III-V nitride semiconductors to electronic devices is also under consideration because the semiconductors have a high breakdown electric field and high electron saturation velocity as their characteristics.

In particular, hetero-junction field effect transistors (HFETs) utilizing two-dimensional electron gas (2DEG) produced at the interface between an aluminum gallium nitride ($Al_xGa_{1-x}N$, where $0<x \le 1$) layer and a gallium nitride (GaN) layer which are sequentially formed by epitaxial growth on a semi-insulating substrate are being developed as high output devices and high frequency devices. In the HFETs, in addition to electrons which are supplied from a carrier supply layer (i.e., an n-type AlGaN Schottky layer), charges are supplied by a polarization effect caused by spontaneous polarization and piezoelectric polarization. Consequently, the HFETs made of group III-V nitride semiconductors have an electron density higher than $10^{13}$ cm$^{-2}$, which is higher than that of HFETs made of aluminum gallium arsenide (AlGaAs) and gallium arsenide (GaAs) by about one digit. As such, the HFETs made of group III-V nitride semiconductors are expected to have a higher drain current density than that of the HFETs made of GaAs. An element having a maximum drain current larger than 1 A/mm is reported. See, for example, Yuji Ando, Yasuhiro Okamoto, Hironobu Miyamoto, Tatsuo Nakayama, Takashi Inoue, Masaaki Kuzuhara, Evaluation of High Breakdown Voltage AlGaN/GaN Heterojunction FET, IEICE Technical Report, ED2002-214, CPM2002-105 (2002-10), pp. 29-34. Furthermore, since group III-V nitride semiconductors have a wide band gap (for example, GaN has a band gap of 3.4 eV) and also exhibit high breakdown voltage characteristics, the HFETs made of group III-V nitride semiconductors can have a breakdown voltage of 100 V or more between a gate electrode and a drain electrode. Therefore, application of electronic devices made of group III-V nitride semiconductors such as HFETs to high frequency elements and elements capable of handling greater power and smaller in size than conventional devices is under consideration. The above described characteristics of group III-V nitride semiconductors enable group III-V nitride semiconductor devices to have an active region of about one-third to one-tenth the sizes of an active region in silicon (Si) semiconductor devices. However, conventional group III-V nitride semiconductor devices, whose electrode pads for connection of wiring have large areas, have a disadvantage that the conventional group III-V nitride semiconductor devices cannot be sufficiently downsized. In particular, when the group III-V nitride semiconductor devices are used as power devices through which a large current passes, the pads can be downsized to a limited extent because it is desirable that wires and ribbons connected to the pads have large diameters and large sizes.

To overcome this disadvantage, the so-called pad-on-element structure in which electrode pads are formed above an active region is suggested in Japanese Unexamined Patent Publication No. 2008-177527, for example. When pad-on-element structure is employed in a power device which handles a high voltage, it is necessary to form an interlayer film having a large thickness in order to prevent a leakage current from being generated between the electrode pads and the electrodes located under the pads.

In order to obtain a high-efficiency device, it is essential to reduce on-resistance of the device. Further, a semiconductor device to be used as a power device needs to have characteristics of being capable of handling a large current and of having a high-breakdown voltage. Reducing on-resistance and increasing gate width allow a semiconductor device to possess these characteristics, and thereby cause the semiconductor device to have a larger maximum current.

SUMMARY

However, increasing the gate width of a FET in a linear manner causes an increase in interconnection resistance, which results in an increase in the on-resistance. Thus, sufficient reduction of the on-resistance cannot be achieved by increasing the gate width in a linear manner. This increasing of the gate width also causes a source potential to increase and a gate potential to decrease, and thereby reduces the voltage difference ($\Delta VGS$) between source electrodes and the gate electrodes. Consequently, it is impossible to obtain a maximum current which is large as expected in view of the increase in the gate width.

It is therefore an object of the present disclosure to enable obtainment of a nitride semiconductor device of which on-resistance is reduced and the maximum current per gate width is large.

To achieve the object, the nitride semiconductor device of the present disclosure includes electrodes which are divided into a plurality of sections and a plurality of layers which include interconnects and are in connection to the plurality of sections of the electrodes.

Specifically, the nitride semiconductor device of the present disclosure includes: a substrate; a nitride semiconductor layer formed over the substrate and including an active region; first electrode interconnect layers extending in parallel with one another over the active region of the nitride semiconductor layer and divided by areas extending on the nitride semiconductor layer across a longitudinal direction of the first electrode interconnect layers; first gate electrodes extending along the first electrode interconnect layers on the nitride semiconductor layer; first gate electrode connecting interconnects extending in associated ones of the areas dividing the first electrode interconnect layers and perpendicularly to a longitudinal direction of the first gate electrodes, and being in electrical connection to the first gate electrodes; first electrode connecting interconnects formed above the first gate electrode connecting interconnects and being in electrical connection to the first electrode interconnect layers; an interconnect insulating film formed over the first electrode interconnect layers and the first electrode connecting interconnects, and having openings, where the first electrode connecting interconnects are exposed through associated ones of the openings; and first electrode upper interconnects formed on the first electrode connecting interconnects with the interconnect insulating film interposed therebetween, and being in electrical connection to the first electrode connecting interconnects through the associated ones of the openings.

In the nitride semiconductor device of the present disclosure, the first electrode interconnect layers are divided by the areas extending across the longitudinal direction of the first electrode interconnect layers, and the first gate electrodes extend along the first electrode interconnect layers. Consequently, the semiconductor device has a configuration in which a plurality of island-like cells form transistors. In this configuration, since each of the cells has a small length of interconnect, the interconnection resistance of the electrodes in each cell can be reduced. As the cells decrease in size, the number of the cells per chip of an identical size increases whereas the rate at which the resistance of the parallel connected interconnects contributes to the on-resistance of the entire device decreases. Accordingly, the on-resistance of the entire device can be reduced. In addition, since the length of interconnect of each cell is small, reduction of ΔVGS caused by an increase in a source potential and a decreases in a gate potential can be alleviated and a decrease in the maximum current can be prevented. Multiple ones of the whole cells are connected to an associated one of the first electrode connecting interconnects and an associated one of the first gate electrode connecting interconnects, and the associated first electrode connecting interconnect and the associated first gate electrode connecting interconnect are disposed in parallel with each other in a thickness direction of the substrate. This configuration can reduce the rate of area that the electrode connecting interconnects occupy in the chip while increasing the gate width of transistor per unit chip area. As a result, the on-resistance can be reduced. Furthermore, since the first electrode upper interconnects are formed on and in connection to the first electrode connecting interconnects, it is possible to prevent occurrence of electron migration (EM) even with the first electrode connecting interconnects having a small width.

The nitride semiconductor device of the present disclosure preferably includes: second electrode interconnect layers extending between and along the first electrode interconnect layers over the active region of the nitride semiconductor layer, and divided by the areas extending across a longitudinal direction of the second electrode interconnect layers; second electrode connecting interconnects being in electrical connection to the second electrode interconnect layers and formed in associated ones of the areas, wherein the associated ones of the area divide the first and second electrode interconnect layers and are devoid of the first gate electrode connecting interconnects; and second electrode upper interconnects formed on the second electrode connecting interconnects with the interconnect insulating film interposed therebetween, wherein the second electrode connecting interconnects are also exposed through associated ones of the openings of the interconnect insulating film, and the second electrode connecting interconnects are in electrical connection to the second electrode upper interconnects through the associated ones of the openings of the interconnect insulating film.

With this configuration, since the second electrode connecting interconnects are provided in the associated areas dividing the first and second electrode interconnect layers and being devoid of the first gate electrode connecting interconnects, a high voltage can be applied to the second electrode interconnect layers, and the device of the present disclosure can be used as a power device. In addition, since the second electrode upper interconnects are formed on and in connection to the second electrode connecting interconnects, it is possible to prevent occurrence of EM even with the second electrode connecting interconnects having a small width. When the second electrode interconnect layers included in the cells have a small width, it becomes difficult to form the second electrode upper interconnects such that the second electrode upper interconnects are in connection to the second electrode interconnect layers through the interconnect insulting film. The configuration in which the second electrode connecting interconnects are in connection to the second electrode interconnect layers enables formation of the second electrode upper interconnects that are in electrical connection to a plurality of cell groups.

In the nitride semiconductor device of the present disclosure, it is preferable that the first electrode interconnect layers are also exposed through the associated ones of the openings of the interconnect insulating film, and the first electrode upper interconnects are in electrical connection to the first electrode interconnect layers through the associated ones of the openings of the interconnect insulating film.

The first electrode upper interconnects are thus in direct connection to not only the first electrode connecting interconnects but also the first electrode interconnect layers. Accordingly, the interconnection resistance of the first electrode interconnect layers in the cells can be reduced. In addition, it is possible to design the first electrode upper interconnects to have a large width and to reduce electric resistance of the first electrode upper interconnects.

In the nitride semiconductor device of the present disclosure, it is preferable that the second electrode interconnect layers are also exposed through the associated ones of the openings of the interconnect insulating film, and the second electrode upper interconnects are in electrical connection to the second electrode interconnect layers through the associated ones of the openings of the interconnect insulating film.

The second electrode upper interconnects are thus in direct connection to not only the second electrode connecting interconnects but also the second electrode interconnect layers. Accordingly, the interconnection resistance of the second electrode interconnect layers in the cells can be reduced. In addition, it is possible to design the second electrode upper interconnects to have a large width and to reduce electric resistance of the second electrode upper interconnects.

In the nitride semiconductor device of the present disclosure, it is preferable that the first electrode interconnect layers include first electrodes formed directly on the nitride semiconductor layer and first electrode interconnects formed on the first electrodes, an electrode insulating film covering the first gate electrodes and the first gate electrode connecting interconnects and having openings is formed on the nitride semiconductor layer, the first electrodes are exposed through associated ones of the openings of the electrode insulating film, and the first electrode interconnects are in electrical connection to the first electrodes through the associated ones of the openings of the electrode insulating film.

In this case, it is preferable that the second electrode interconnect layers include second electrodes formed directly on the nitride semiconductor layer and second electrode interconnects formed on the second electrodes, the second electrodes are also exposed through associated ones of the openings of the electrode insulating film, and the second electrode interconnects are in electrical connection to the second electrodes through the associated ones of the openings of the electrode insulating film.

In the nitride semiconductor device of the present disclosure, the first gate electrode connecting interconnects preferably have a larger width than the first gate electrodes.

This configuration in which the interconnects have a larger width can prevent occurrence of EM and reduction of the potential.

In the nitride semiconductor device of the present disclosure, it is preferable that the first electrode connecting interconnects have a larger width than the first electrode interconnects.

This configuration makes it easy to establish connection between the first electrode upper interconnects and the components located under the first electrode upper interconnects through the interconnect insulating film, and can prevent occurrence of EM.

In the nitride semiconductor device of the present disclosure, the second electrode connecting interconnects preferably have a larger width than the second electrode interconnects.

This configuration makes it easy to establish connection between the second electrode upper interconnects and the components located under the second electrode upper interconnects through the interconnect insulating film, and can prevent occurrence of EM.

The nitride semiconductor device of the present disclosure preferably includes: a first electrode pad which is located on the interconnect insulating film and above the active region, and is integral with the first electrode upper interconnects; and a second electrode pad which is located on the interconnect insulating film and above the active region, and is integral with the second electrode upper interconnects.

This configuration, in which the first electrode upper interconnects, the second electrode upper interconnects, the first electrode pad, and the second electrode pad are formed in the same layer, can reduce the on-resistance with a small number of metal layers.

The nitride semiconductor device of the present disclosure may further include: second gate electrodes extending along the second electrode interconnect layers on the nitride semiconductor layer; and second gate electrode connecting interconnects being in electrical connection to the second gate electrodes and extending perpendicularly to a longitudinal direction of the second gate electrodes in associated ones of the areas, wherein the associated ones of the areas divide the first and second electrode interconnect layers and are devoid of the first gate electrode connecting interconnects.

In a manner similar to the single-gate structure device, this configuration enables the double-gate structure device including first gate electrodes and second gate electrodes to have reduced on-resistance and a sufficiently large maximum current.

In this case, the second gate electrode connecting interconnects preferably have a larger width than the second gate electrodes.

This configuration in which the interconnects have a larger width can prevent occurrence of EM and reduction of the potential.

According to the present disclosure, a nitride semiconductor device of which the on-resistance is reduced and the maximum current per gate width is large can be obtained.

BRIEF DESCRIPTION OF THE DRAWINGS

FIG. 3(a) is a plan view illustrating a layer where gate electrodes, source electrodes, and drain electrodes are located and a layer located under the layer of these electrodes. FIG. 3(b) is a plan view illustrating a layer where source electrode interconnects and drain electrode interconnects are located and components located under the layer of these electrode interconnects. FIG. 3(c) is a plan view illustrating a second insulating film and components located under the second insulting film. FIG. 3(d) is a plan view illustrating source electrode upper interconnects and drain electrode upper interconnects, and components located under these interconnects.

FIG. 5(a) is a plan view illustrating a layer where G1 electrodes, G2 electrodes, S1 electrodes, and S2 electrodes are located and a layer located under the layer of these electrodes. FIG. 5(b) is a plan view illustrating a layer where S1 electrode interconnects and S2 electrode interconnects are located and components located under the layer of these electrode interconnects. FIG. 5(c) is a plan view illustrating a second insulating film and components located under the second insulting film. FIG. 5(d) is a plan view illustrating S1 electrode upper interconnects and S2 electrodes upper interconnects and components located under these interconnects.

DETAILED DESCRIPTION (First Embodiment)

A nitride semiconductor device according to a first embodiment of the present disclosure will be described below with reference to FIGS. 1-3.

Figure 1:
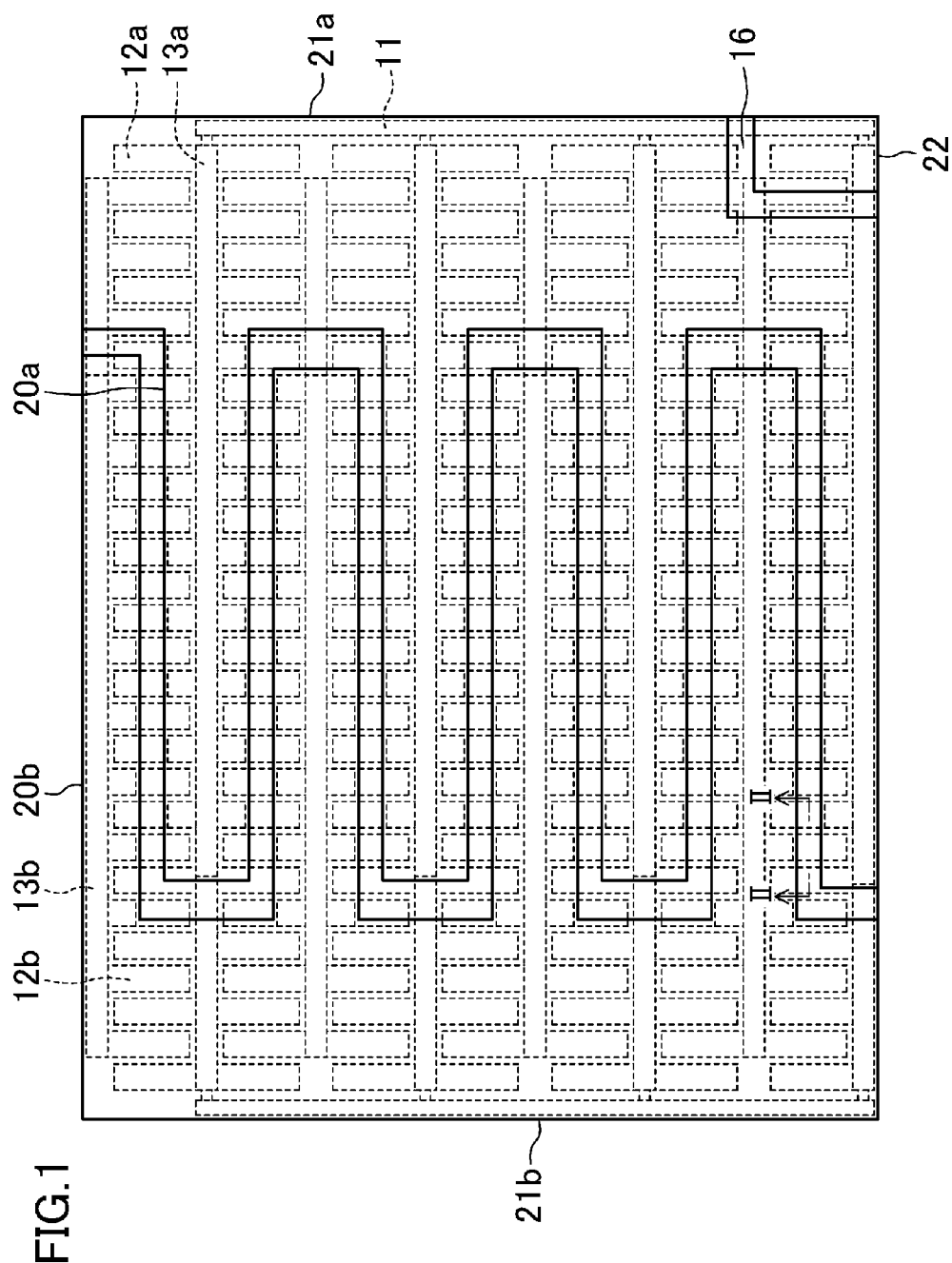
FIG. 1 is a plan view illustrating a nitride semiconductor device according to a first embodiment of the present disclosure.
Figure 2:
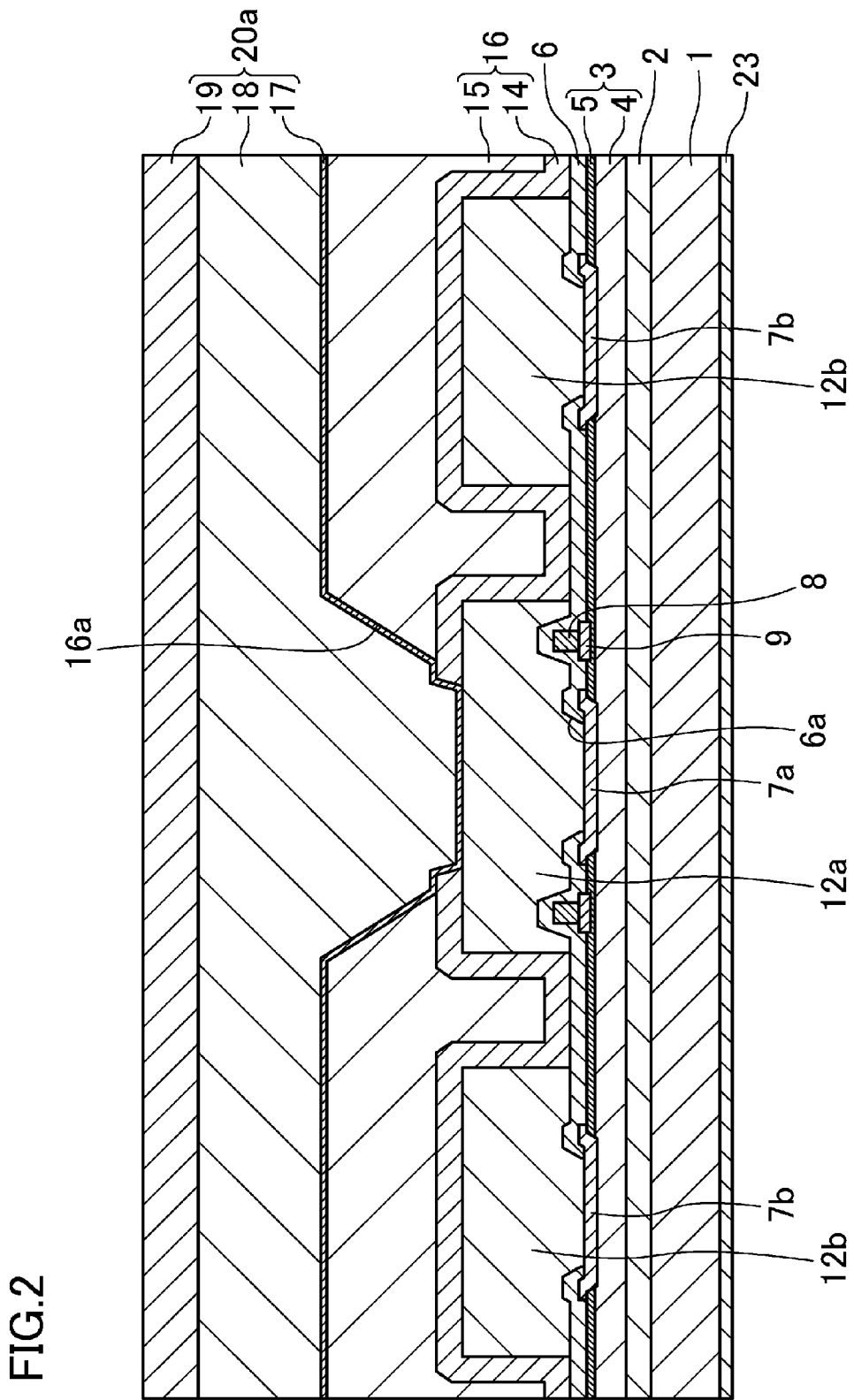
FIG. 2 is a cross-sectional view of the nitride semiconductor device according to the first embodiment of the present disclosure, taken along the line II-II in FIG. 1.

As illustrated in FIGS. 1 and 2, the nitride semiconductor device of the first embodiment includes a buffer layer 2 and a nitride semiconductor layer 3 sequentially formed on a substrate 1 made of silicon (Si). The nitride semiconductor layer 3 includes an undoped gallium nitride (GaN) layer 4 having a thickness of about 2.5 μm and an undoped aluminum gallium nitride (AlGaN) layer 5 having a thickness of about 50 nm and formed on the undoped GaN layer 4. Two-dimensional electron gas (2DEG) which is produced in an interface region between the undoped GaN layer 4 and the undoped AlGaN layer 5 functions as a channel region.

On the nitride semiconductor layer 3, source electrodes 7a which are first electrodes and drain electrodes 7b which are second electrodes are alternately spaced from one another. In this embodiment, in order to reduce contact resistance, parts of the undoped AlGaN layer 5 and parts of the undoped GaN layer 4 are removed, and the source electrodes 7a and the drain electrodes 7b are formed such that the lower surfaces of the electrodes 7a and 7b are located lower than the interface between the undoped AlGaN layer 5 and the undoped GaN layer 4. The source electrodes 7a and the drain electrodes 7b are each made of a metal such as titanium (Ti) or aluminum (Al). The thickness of the undoped AlGaN layer 5 is reduced in portions each of which is located between adjacent ones of the source electrodes 7a and the drain electrodes 7b and has a width of about 1 μm. P-type GaN layers 9 which have a thickness of about 200 nm and are doped with magnesium (Mg) are each formed on an associated one of the portions with the reduced thickness of the undoped AlGaN layer 5. Gate electrodes 8 made of, e.g., palladium (Pd), gold (Au), or platinum (Pt) are formed on the p-type GaN layers 9. The p-type GaN layers 9 and the undoped AlGaN layer 5 thus form PN junctions. Consequently, even if the voltage applied to the gate electrodes 8 is 0 V, depletion layer expands in the undoped AlGaN layer 5 and the undoped GaN layer 4 from the p-type GaN layers 9 toward the substrate 1 and the drain electrodes 7*b*. In this manner, a current passing through the channel region is interrupted, and normally-off operation can be performed.

The nitride semiconductor device of this embodiment is a field effect transistor (a FET) having a multi-finger structure in which nitride semiconductors are used. Supposing that one source electrode 7*a*, one drain electrode 7*b*, and one gate electrode 8 which are adjacent to one another form a unit, it can be considered that the nitride semiconductor device of this embodiment includes a plurality of the units and the units are alternately inverted about the drain electrode 7*b* as the axis. As will be described later, electrical connections are established across the units, between the source electrodes 7*a*, between the drain electrodes 7*b*, and between the gate electrodes 8. In this manner, the gate width of the nitride semiconductor device can be considerably increased, and a power device capable of allowing a large current to pass can be obtained. In this embodiment, a region which includes the channel region and the region of the nitride semiconductor layer 3 where a group of the source electrodes 7*a* and the drain electrodes 7*b* are located, and which is not dielectrically isolated is referred to as the active region.

Figure 3:
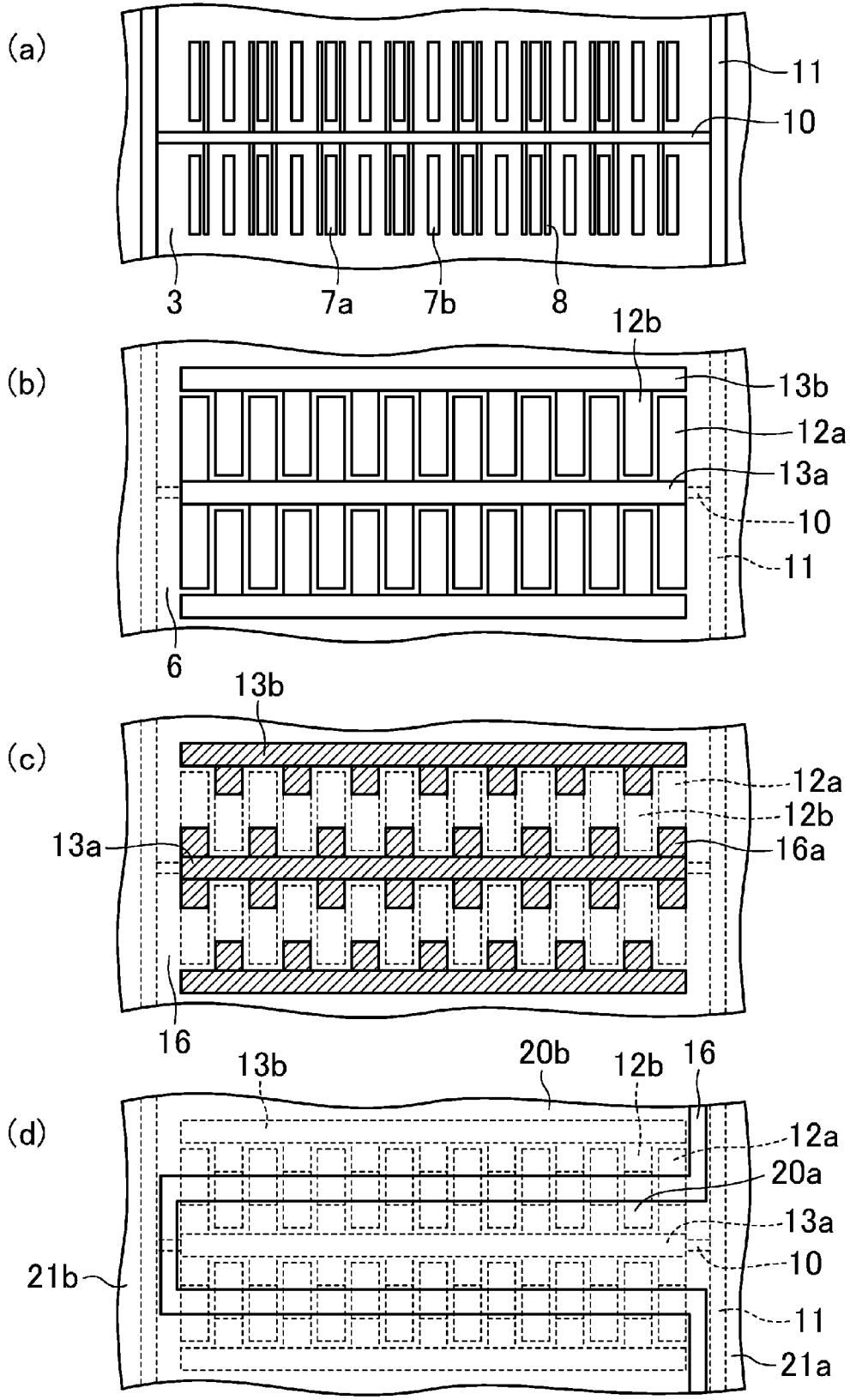
FIGS. 3(a) to 3(d) illustrate layers included in the nitride semiconductor device according to the first embodiment of the present disclosure.

As illustrated in FIG. 3(*a*), the source electrodes 7*a* and the drain electrodes 7*b* are arranged in parallel with one another to form a multi finger structure. The electrodes 7*a* and 7*b* are divided by areas which extend on the nitride semiconductor layer 3 substantially perpendicular to the longitudinal direction of the electrodes 7*a* and 7*b*. The areas dividing the electrodes 7*a* and 7*b* may serve as inactive regions. The gate electrodes 8 extend along the source electrodes 7*a* and between the adjacent ones of the source electrodes 7*a* and the drain electrodes 7*b*. Gate electrode connecting interconnects 10 each of which is in connection to multiple ones of the gate electrodes 8 extend in associated ones of the areas dividing the source electrodes 7*a* and the drain electrodes 7*b* perpendicularly to the longitudinal direction of the gate electrodes 8. In this manner, the length of interconnect of each of the gate electrodes can be reduced, and accordingly, it is possible to prevent a voltage drop of the gate electrodes caused by a gate leakage current. Consequently, ΔVGS can be set to a desired value and a decrease in the maximum current of the device can be prevented. In addition, since the multi-finger type source electrodes 7*a* and drain electrodes 7*b* are each divided, interconnection resistance of the source electrode 7*a* and the drain electrode 7*b* in each cell can be reduced, and reduction of ΔVGS caused by the source potential increased by the interconnection resistance of the source electrodes 7*a* can be alleviated. As a result, the on-resistance of the device can be reduced, and decrease in the maximum current of the device can be prevented.

Gate electrode convergence interconnects 11 are formed in portions of a region surrounding the active region, and the multiple gate electrode connecting interconnects 10 converge at and connect with the gate electrode convergence interconnects 11. The gate electrode convergence interconnects 11 extend perpendicularly to the longitudinal direction of the gate electrode connecting interconnects 10, i.e., in parallel with the longitudinal direction of the gate electrodes 8. The gate electrode convergence interconnects 11 may be formed within the active region, in particular, in a central portion of the active region. The gate electrode convergence interconnects 11 do not necessarily have to be formed in the layer where the gate electrodes 8 are located, and may be in connection to an interconnect layer which is in connection to ends of the gate electrode connecting interconnects 10 and located over the gate electrodes 8. It is preferable that the p-type GaN layers 9 are formed between the nitride semiconductor layer 3 and the gate electrode connecting interconnects 10, and between the nitride semiconductor layer 3 and the gate electrode convergence interconnects 11. However, when the gate electrode connecting interconnects 10 and the gate electrode convergence interconnects 11 are located above the inactive regions, the p-type GaN layers 9 are not necessary. The gate electrode connecting interconnects 10 and the gate electrode convergence interconnects 11 preferably have widths which are larger than that of the gate electrodes 8.

A first insulating film 6 having a thickness of about 300 nm and made of, e.g., nitride silicon (SiN) is formed on the nitride semiconductor layer 3, the source electrodes 7*a*, the drain electrodes 7*b*, the gate electrodes 8, the p-type GaN layers 9, and the gate electrode connecting interconnects 10. The first insulating film 6 has openings 6*a* through which parts of the surfaces (upper surfaces) of the source electrodes 7*a* and the drain electrodes 7*b* are exposed. The first insulating film 6 is provided to stabilize the surface of the nitride semiconductor layer 3 and to prevent moisture from entering the nitride semiconductor layer 3 from an interlayer insulating film 15 which will be described later.

Source electrode interconnects 12*a* made of, e.g., Au are formed on the source electrodes 7*a* such that the source electrode interconnects 12*a* are in connection to the source electrodes 7*a* through associated ones of the openings 6*a* of the first insulating film 6. The source electrodes 7*a* and the source electrode interconnects 12*a* together form first electrode interconnect layers. The source electrode interconnects 12*a* each include a Ti layer serving as an adhesion layer in order to improve adhesion to the first insulating film 6. The source electrode interconnects 12*a* have a thickness of about 5 μm and a width larger than the widths of the source electrodes 7*a* and the drain electrodes 7*b*. Here, each of the source electrode interconnects 12*a* on the source electrodes 7*a* covers the gate electrodes 8 included in the two units adjacent to each other, and the width of each of the source electrode interconnects 12*a* extends over the gate electrodes 8 toward the drain electrodes 7*b*. Each of the source electrode interconnects 12*a* thus functions as a source field plate. In a similar manner, drain electrode interconnects 12*b* are formed on the drain electrodes 7*b* such that the drain electrode interconnects 12*b* are in connection to the drain electrodes 7*b* through associated ones of the openings 6*a* of the first insulating film 6. The drain electrodes 7*b* and the drain electrode interconnects 12*b* together form second electrode interconnect layers.

As illustrated in FIG. 3(*b*), the source electrode interconnects 12*a* on the source electrodes 7*a* are in connection to source electrode connecting interconnects 13*a* which are formed on the gate electrode connecting interconnects 10 with the first insulating film 6 interposed between the interconnects 13*a* and 10. The drain electrode interconnects 12*b* on the drain electrodes 7*b* are in connection to drain electrode connecting interconnects 13*b* which extend on the first insulating film 6 and above the areas dividing the source electrodes 7*a* and the drain electrodes 7*b* and being devoid of the gate electrode connecting interconnects 10. It is preferable that the source electrode connecting interconnects 13*a* have a larger width than the source electrode interconnects 12a, and the drain electrode connecting interconnects 13b have a larger width than the drain electrode interconnects 12b. This configuration enables prevention of occurrence of electron migration (EM) caused by current concentration, and prevention of increase in the interconnection resistance. In addition, this configuration makes it easy to form upper interconnects on the source electrode connecting interconnects 13a, the drain electrode connecting interconnects 13b, the source electrode interconnects 12a, and the drain electrode interconnects 12b such that the upper interconnects are in connection to the interconnects 13a, 13b, 12a, and 12b. Specifically, as will be detailed later, a second insulating film 16 having openings 16a is formed on the source electrode connecting interconnects 13a, the drain electrode connecting interconnects 13b, the source electrode interconnects 12a, and the drain electrode interconnects 12b. The upper interconnects are in connection to the interconnects 13a, 13b, 12a, and 12b through the openings 16a of the second insulating film 16. Since the second insulating film 16 has a large thickness and the widths of the source electrode interconnects 12a and the drain electrode interconnects 12b, which depend on the width of the transistor unit, cannot be increased freely, it is difficult to bring, without fail, the source electrode interconnects 12a and the drain electrode interconnects 12b into connection to the upper interconnects located above the interconnects 12a and 12b. In view of this, the source electrode connecting interconnects 13a and the drain electrode connecting interconnects 13b are designed to have larger widths as described above, and thus, the upper interconnects can be in connection to at least the electrode connecting interconnects 13a and 13b. However, in order to reduce the interconnection resistance of the device, it is desirable that the upper interconnects are also in connection to the source electrode interconnects 12a and the drain electrode interconnects 12b.

Further, it is desirable that the source electrode connecting interconnects 13a and the drain electrode connecting interconnects 13b are alternately arranged in the longitudinal direction of the source electrodes 7a and the drain electrodes 7b. Here, it is also desirable that none of the openings 6a of the first insulating film 6 is located between the source electrode connecting interconnects 13a and the gate electrode connecting interconnects 10, and sufficient insulation is provided between the interconnects 13a and 10. It is also desirable the first insulating film 6 has a thickness which is required to provide the sufficient insulation.

A protective film 14 having a thickness of about 400 nm and made of e.g., SiN is formed on the first insulating film 6, the source electrode interconnects 12a, the drain electrode interconnects 12b, the source electrode connecting interconnects 13a, and the drain electrode connecting interconnects 13b. The interlayer insulating film 15 having a thickness of about 10 μm and made of, e.g., polybenzoxazole (PBO) is formed on the protective film 14. Here, the protective film 14 and the interlayer insulating film 15 are collectively referred to as the second insulating film 16. In a manner similar to the first insulating film 6, the protective film 14 serves as a moist resistance film for the nitride semiconductor layer 3 and functions as an adhesion layer between the electrode interconnects 12a and 12b and the interlayer insulating film 15.

The second insulating film 16 has the openings 16a through which parts of the source electrode interconnects 12a and parts the drain electrode interconnects 12b are exposed. As specifically illustrated in FIG. 3(c), in addition to the parts of the source and drain electrode interconnects 12a and 12b, the source electrode connecting interconnects 13a and the drain electrode connecting interconnects 13b are exposed through the openings 16a (i.e., the diagonally shaded portions in FIG. 3(c)). Here, only the source electrode connecting interconnects 13a and the drain electrode connecting interconnects 13b may be exposed through the openings 16a. However, the configuration in which the parts of the electrode interconnects 12a and the parts of the drain electrode interconnects 12b are also exposed through the openings 16a and the upper interconnects being in connection to the interconnects 12a and 12b are provided over the interconnects 12a and 12b can further reduce the interconnection resistance of the interconnects 12a and 12b. It is preferable that the length of each of the exposed parts of the source electrode interconnects 12a and the drain electrode interconnects 12b is less than one-half the longitudinal length of each of the interconnects 12a and 12b. However, the length of the exposed parts of the source electrode interconnects 12a and the drain electrode interconnects 12b located immediately under electrode pads 21a and 21b which are to be formed later does not have to be less than one-half the length of the interconnects 12a and 12b. Specifically, if the size of each of the electrode pads 21a and 21b is sufficiently larger than that of each cell, it is desirable that, under the source electrode pad 21a, the second insulating film 16 has the openings 16a through which the source electrode interconnects 12a are entirely exposed while being devoid of openings through which the drain electrode interconnects 12b are exposed. Further, it is desirable that, under the drain electrode pad 21b, the second insulating film 16 has the openings 16a through which the drain electrode interconnects 12b are entirely exposed while being devoid of openings through which the source electrode interconnects 12a are exposed.

The upper interconnects include source electrode upper interconnects 20a and drain electrode upper interconnects 20b. The source electrode upper interconnects 20a are formed on the second insulating film 16 and in connection to the source electrode interconnects 12a and the source electrode connecting interconnects 13a through associated ones of the openings 16a in a selective manner. In a similar manner, as illustrated in FIG. 3(d), the drain electrode upper interconnects 20b are formed on the second insulating film 16 and are in connection to the drain electrode interconnects 12b and the drain electrodes connecting interconnects 13b through associated ones of the openings 16a in a selective manner. The source electrode upper interconnects 20a extend along the source electrode connecting interconnects 13a whereas the drain electrode upper interconnects 20b extend along the drain electrode connecting interconnects 13b. The source electrode upper interconnects 20a and the drain electrode upper interconnects 20b each include a lower adhesion layer 17 made of, e.g., titanium (Ti), a conductive layer 18 made of, e.g., copper (Cu), and an upper metal layer 19 made of, e.g., nickel (Ni) which are sequentially stacked. The lower adhesion layer 17 has a thickness of about 100 nm, the conductive layer 18 has a thickness of about 5 μm, and the upper metal layer 19 has a thickness of about 1 μm.

The source electrode pad 21a and the drain electrode pad 21b which are respectively integral with the source electrode upper interconnects 20a and the drain electrode upper interconnects 20b are located on the second insulating film 16. Thus, the source electrode pad 21a and the drain electrode pad 21b are made of the same materials as the materials for the source electrode upper interconnects 20a and the drain electrode upper interconnects 20b. The source electrode pad 21a and the drain electrode pad 21b are located above the active region. The source electrode pad 21a is in connection to the source electrode connecting interconnects 13a and parts of the source electrode interconnects 12a through associated ones of the openings 16a of the second insulating film 16. In a similar manner, the drain electrode pad 21b is in connection to the drain electrode connecting interconnects 13b and the parts of the drain electrode interconnects 12b through associated ones of the openings 16a of the second insulating film 16. Further, a gate electrode pad 22 is formed on the second insulating film 16, and the gate electrode pad 22 is in connection to an associated one of the gate electrode convergence interconnects 11 through an associated one of the openings 16a.

On a surface (a back surface) of the substrate 1 opposite to the surface on which the nitride semiconductor layer 3 is located, a back surface electrode 23 made of, e.g., Au or tin (Sn) is formed. It is possible to provide an electric potential to the substrate 1 from outside.

Since the widths of the interconnects located under the source electrode upper interconnects 20a and the drain electrode upper interconnects 20b depend on the width of the transistor unit, the widths cannot be increased freely. Consequently, the interconnection resistance cannot be reduced sufficiently. On the other hand, the configuration in which the source electrode upper interconnects 20a and the drain electrode upper interconnects 20b which do not depend on the width of the unit are formed over the interconnects whose widths depend on the width of the transistor unit enables a considerable reduction of the interconnection resistance of the device. In addition, forming the source electrode upper interconnects 20a, the drain electrode upper interconnects 20b, the source electrode pad 21a, and the drain electrode pad 21b in an identical layer enables the device to have small on-resistance and a sufficient maximum current with a small number of layers including interconnects. Furthermore, the electrode pads located above the active region can reduce a chip area of the device.

According to the first embodiment of the present disclosure, a nitride semiconductor device of which the on-resistance is reduced and the maximum current per gate width is large can be obtained.

(Second Embodiment)

Figure 4:
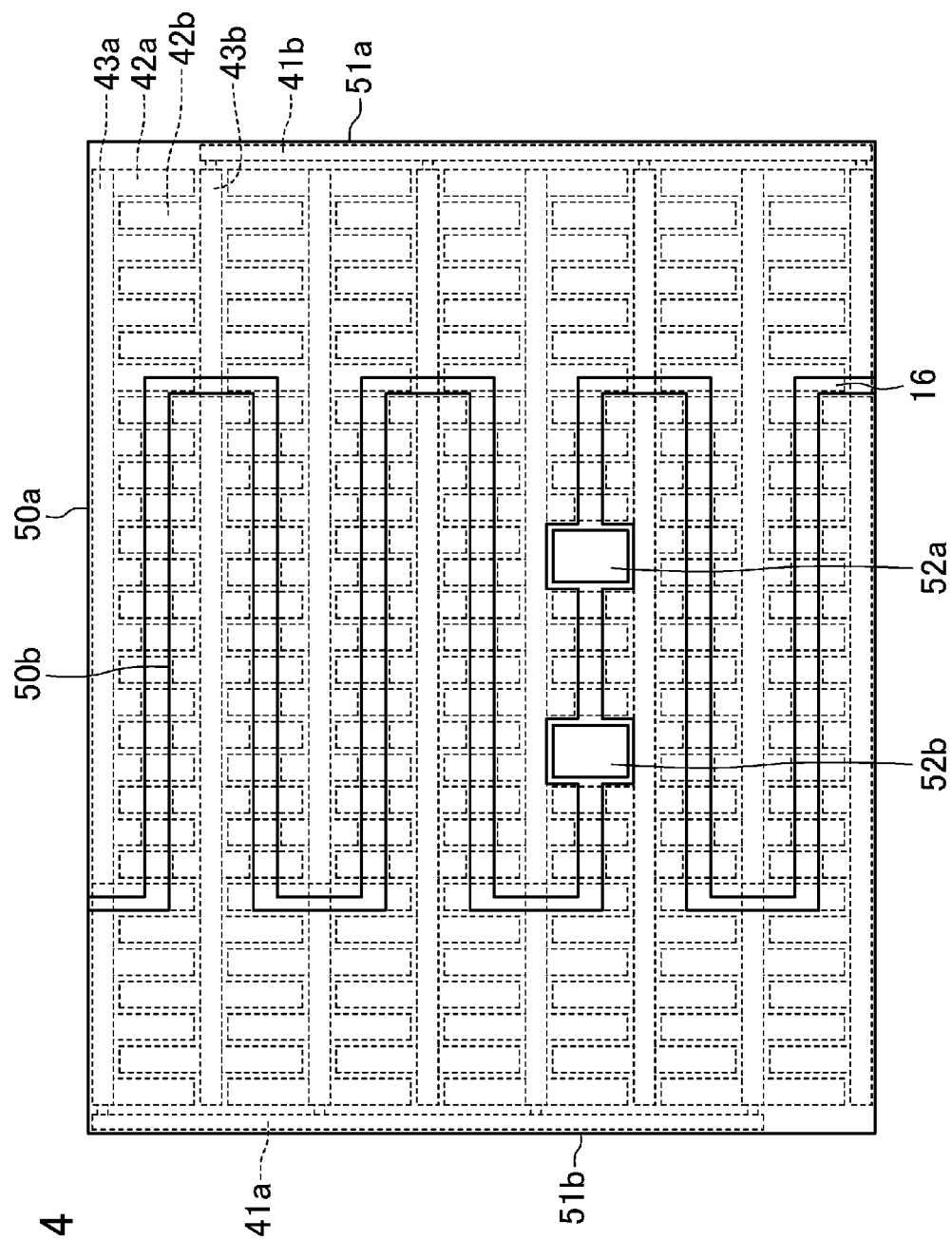
FIG. 4 is a plan view illustrating a nitride semiconductor device according to a second embodiment of the present disclosure.
Figure 5:
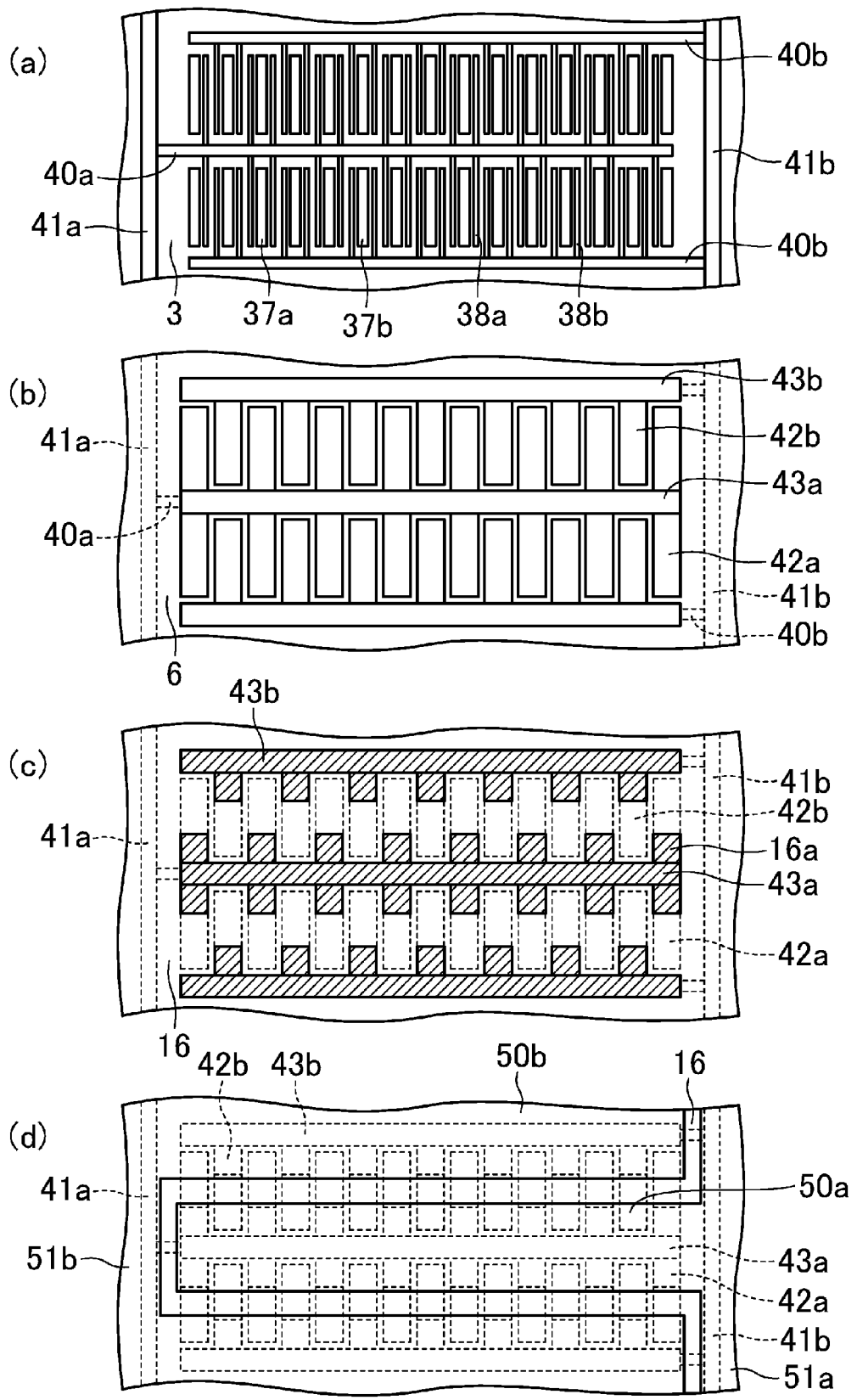
FIGS. 5(a) to 5(d) illustrate layers included in the nitride semiconductor device according to the second embodiment of the present disclosure.

A nitride semiconductor device according to a second embodiment of the present disclosure will be described below with reference to FIGS. 4 and 5. In this embodiment, the same components as those of the first embodiment are denoted by the same reference characters and description thereof is not repeated. Only differences between the first and second embodiments will be detailed.

The nitride semiconductor device of the second embodiment of the present disclosure is a double-gate type nitride semiconductor device including G1 electrodes 38a which are first gate electrodes and G2 electrodes 38b which are second gate electrodes. As illustrated in FIGS. 4 and 5, a G1 electrode pad 52a and a G2 electrode pad 52b are formed above an active region such that the G1 electrode pad 52a and the G2 electrode pad 52b are respectively in electrical connection to the G1 electrodes 38a and the G2 electrodes 38b. In a similar manner, an S1 electrode pad 51a and an S2 electrode pad 51b are formed above the active region such that the S1 electrode pad 51a and the S2 electrode pad 51b are respectively in electrical connection to S1 electrodes 37a which are first electrodes and S2 electrodes 37b which are second electrodes.

As specifically illustrated in FIG. 5(a), the S1 electrodes 37a and the S2 electrodes 37b are arranged to form a multi-finger structure on a nitride semiconductor layer 3. The 51 electrodes 37a and the S2 electrodes 37b are divided by areas which extend substantially perpendicular to the longitudinal direction of the electrodes 37a and 37b. The areas dividing the electrodes 37a and 37b may serve as inactive regions. The G1 electrodes 38a and the G2 electrodes 38b extend along the S1 electrodes 37a and the S2 electrode 37b, respectively. G1 electrode connecting interconnects 40a and G2 electrode connecting interconnects 40b are alternately formed in the areas dividing the S1 electrodes 37a and the S2 electrodes 37b. The G1 electrode connecting interconnects 40a and the G2 electrode connecting interconnects 40b are respectively in connection to the G1 electrodes 38a and the G2 electrodes 38b, and extend perpendicularly to the longitudinal direction of the G1 electrodes 38a and the G2 electrodes 38b. In this manner, the length of interconnect of each of the gate electrodes can be reduced, and accordingly, it is possible to prevent a voltage drop of the gate electrodes caused by a gate leakage current. Consequently, $\Delta VGS$ can be set to a desired value and a decrease in the maximum current of the device can be prevented. In addition, since the Si electrodes 37a and the S2 electrodes 37b are each divided, the interconnection resistance of the S1 electrode 37a and the S2 electrode 37b in each cell can be reduced, and reduction of $\Delta VGS$ caused by an increase in the interconnection resistance of each electrode can be alleviated. As a result, the on-resistance of the device caused by the interconnection resistance of the S1 electrodes 37a and the S2 electrodes 37b can be reduced, and a decrease in the maximum current of the device can be prevented.

A G1 electrode convergence interconnect 41a is formed in a portion of a region surrounding the active region, and the multiple G1 electrode connecting interconnects 40a converge at and connect with the G1 electrode convergence interconnect 41a. A G2 electrode convergence interconnect 41b is formed in a portion of the region surrounding the active region, and the multiple G2 electrode connecting interconnects 40b converge at and connect with the G2 electrode convergence interconnect 41b. The G1 electrode convergence interconnect 41a and the G2 electrode convergence interconnect 41b extend in parallel with the longitudinal direction of the G1 electrodes 38a and the G2 electrodes 38b. The G1 electrode convergence interconnect 41a and the G2 electrode convergence interconnect 41b may be formed within the active region, in particular, in a central portion of the active region. However, it is desirable that the G1 electrode convergence interconnect 41a is located under or near the S2 electrode pad 51b, and the G2 electrode convergence interconnect 41b is located under or near the S1 electrode pad 51a. The G1 electrode convergence interconnect 41a and the G2 electrode convergence interconnect 41b do not necessarily have to be formed in the layer where the G1 electrodes 38a and the G2 electrodes 38b are located, and may be in connection to an interconnect layer which is in connection to ends of the G1 electrode connecting interconnects 40a and ends of the G2 electrode connecting interconnects 40b and located over the G1 electrodes 38a and the G2 electrodes 38b. In a manner similar to the first embodiment, when the G1 electrode connecting interconnects 40a, the G2 electrode connecting interconnects 40b, G1 electrode convergence interconnect 41a, and the G2 electrode convergence interconnect 41b are formed above the inactive regions, p-type GaN layers do not necessarily have to be formed under these electrode collecting/convergence interconnects. It is preferable that the G1 electrode connecting interconnects 40a and the G1 electrode convergence interconnect 41a have widths larger than that of the G1 electrodes 38a, and the G2 electrode connecting interconnects 40b and the G2 electrode convergence interconnect 41b have widths larger than that of the G2 electrodes 38b.

As illustrated in FIG. 5(b), a first insulating film 6 is formed on the foregoing electrodes and interconnects. The first insulating film 6 has openings 6a through which parts of the S1 electrode 37a and parts of the S2 electrode 37b are exposed. S1 electrode interconnects 42a are formed on the S1 electrodes 37a with the first insulating film 6 interposed therebetween, and S2 electrode interconnects 42b are formed on the S2 electrodes 37b with the first insulating film 6 interposed therebetween. The S1 electrode interconnects 42a are in connection to the S1 electrodes 37a through associated ones of the openings 6a. The S2 electrode interconnects 42b are in connection to the S2 electrodes 37b through associated ones of the openings 6a. Thus, the S1 electrode interconnects 42a and the S1 electrodes 37a together form first electrode interconnect layers, and the S2 electrode interconnects 42b and the S2 electrodes 37b together form second electrode interconnect layers. S1 electrode connecting interconnects 43a are formed on the G1 electrode connecting interconnects 40a with the first insulating film 6 interposed therebetween, and S2 electrode connecting interconnects 43b are formed on the G2 electrode connecting interconnects 40b with the first insulating film 6 interposed therebetween. The S1 electrode connecting interconnects 43a are in connection to the S1 electrode interconnects 42a, and the S2 electrode connecting interconnects 43b are in connection to the S2 electrode interconnects 42b. It is preferable that the S1 electrode connecting interconnects 43a have a larger width than the S1 electrode interconnects 42a, and the S2 electrode connecting interconnects 43b have a larger width than the S2 electrode interconnects 42b. This configuration enables prevention of occurrence of EM caused by current concentration, and prevention of increase in interconnection resistance. In addition, this configuration makes it easy to form upper interconnects on the S1 electrode connecting interconnects 43a, the S2 electrode connecting interconnects 43b, the S1 electrode interconnects 42a, and the S2 electrode interconnects 42b such that the upper interconnects are in connection to the interconnects 43a, 43b, 42a, and 42b. Specifically, as will be detailed later, a second insulating film 16 having openings 16a is formed on the S1 electrode connecting interconnects 43a, the S2 electrode connecting interconnects 43b, the S1 electrode interconnects 42a, and the S2 electrode interconnects 42b. The upper interconnects are in connection to the interconnects 43a, 43b, 42a, and 42b through the openings 16a of the second insulating film 16. Since the second insulating film 16 has a large thickness and the widths of the S1 electrode interconnects 42a and the S2 electrode interconnects 42b, which depend on the width of the transistor unit, cannot be increased freely, it is difficult to bring, without fail, S1 electrode interconnects 42a and the S2 electrode interconnects 42b into connection to the upper interconnects located above the interconnects 42a and 42b. In view of this, the S1 electrode connecting interconnects 43a and the S2 electrode connecting interconnects 43b are designed to have larger widths as described above, and thus, the upper interconnects can be in connection to at least the electrode connecting interconnects 43a and 43b. However, in order to reduce the interconnection resistance of the device, it is desirable that the upper interconnects are also in connection to the S1 electrode interconnects 42a and the S2 electrode interconnects 42b.

It is desirable that the S1 electrode connecting interconnects 43a and the S2 electrode connecting interconnects 43b are alternately arranged in the longitudinal direction of the S1 electrodes 37a and the S2 electrodes 37b. Here, it is desirable that none of the openings 6a of the first insulating film 6 is located between the S1 electrode connecting interconnects 43a and the G1 electrode connecting interconnects 40a, and between the S2 electrode connecting interconnects 43b and the G2 electrode connecting interconnects 40b, and sufficient insulation is provided between the electrode connecting interconnects 43a and 40a, and between the electrode connecting interconnects 43b and 40b. It is also desirable the first insulating film 6 has a thickness which is required to provide the sufficient insulation. As illustrated in FIG. 5(c), the second insulating film 16 is formed on the S1 electrode interconnects 42a, the S2 electrode interconnects 42b, the S1 electrode connecting interconnects 43a, and the S2 electrode connecting interconnects 43b. The second insulating film 16 has the openings 16a (i.e., diagonally shaded portions in FIG. 5(c)) through which parts of the S1 electrode interconnects 42a, parts of the S2 electrode interconnects 42b, the S1 electrode connecting interconnects 43a, and the S2 electrode connecting interconnects 43b are exposed. Only the S1 electrode connecting interconnects 43a and the S2 electrode connecting interconnects 43b may be exposed through the openings 16a. However, the configuration in which the parts of S1 electrode interconnects 42a and the parts of the S2 electrode interconnects 42b are also exposed through the openings 16a and the upper interconnects being in connection to the interconnects 42a and 42b are provided over the interconnects 42a and 42b can further reduce the interconnection resistance of the interconnects 42a and 42b. It is preferable that the openings 16a through which the S1 electrode interconnects 42a and the S2 electrode interconnects 42b are exposed has a length smaller than one-half the longitudinal length of the S1 electrode interconnects 42a and the S2 electrode interconnects 42b. Immediately under the S1 electrode pad 51a and the S2 electrode pad 51b, however, the openings 16a through which the S1 electrode interconnects 42a and the S2 electrode interconnects 42b are exposed do not have to have a length smaller than one-half the longitudinal length of the S1 electrode interconnects 42a and the S2 electrode interconnects 42b. Specifically, if the size of each electrode pad is sufficiently larger than that of each cell, it is desirable that, under the S1 electrode pad 51a, the second insulating film 16 has the openings 16a through which the S1 electrode interconnects 42a are entirely exposed while being devoid of openings through which the S2 electrode interconnects 42b are exposed. It is also desirable that, under the S2 electrode pad 51b, the second insulating film 16 has the openings 16a through which the S2 electrode interconnects 42b are entirely exposed while being devoid of openings through which the S1 electrode interconnects 42a are exposed.

The upper interconnects include S1 electrode upper interconnects 50a and S2 electrode upper interconnects 50b. As illustrated in FIG. 5(d), the S1 electrode upper interconnects 50a are formed on the S1 electrode connecting interconnects 43a with the second insulating film 16 interposed therebetween, and the S2 electrode upper interconnects 50b are formed on the S2 electrode connecting interconnects 43b with the second insulating film 16 interposed therebetween. The S1 electrode upper interconnects 50a are in connection to the S1 electrode connecting interconnects 43a through associated ones of the openings 16a of the second insulating film 16. In a similar manner, the S2 electrodes upper interconnects 50b are in connection to the S2 electrode connecting interconnects 43b through associated ones of the openings 16a. The upper interconnects 50a and 50b have the same structure as the source electrode upper interconnects and the like of the first embodiment: the upper interconnects 50a and 50b each have a staked structure including a lower adhesion layer made of, e.g., Ti, a conductive layer made of, e.g., Cu, and an upper metal layer made of, e.g., Ni. The S1 electrode pad 51a which is integral with the S1 electrode upper interconnects 50a and the S2 electrode pad 51b which is integral with the S2 electrode upper interconnects 50b are provided on the second insulating film 16. Thus, the S1 electrode pad 51a and the S2 electrode pad 51b are made of the same materials as those for the S1 electrode upper interconnects 50a and the S2 electrode upper interconnects 50b. The S1 electrode pad 51a and the S2 electrode pad 51b are located above the active region. The G1 electrode pad 52a and the G2 electrode pad 52b are also located in the layer where the S1 electrode pad 51a and the S2 electrode pad 51b are located. Here, for example, the G1 electrode pad 52a is in connection to a line extending from the G1 electrode connecting interconnect 40a that is located nearest to the pad 52a whereas the G2 electrode pad 52b is in connection to a line extending from the G2 electrode connecting interconnect 40b that is located nearest to the pad 52b. In a manner similar to the first embodiment, it is also possible to configure the semiconductor device such that the G1 electrode pad 52a and the G2 electrode pad 52b are respectively located on and in connection to the G1 electrode convergence interconnect 41a and the G2 electrode convergence interconnect 41b that are located in the region surrounding the active region.

Since the widths of the interconnects located under the S1 electrode upper interconnects 50a and the S2 electrode upper interconnects 50b depend on the width of the transistor unit, the widths cannot be increased freely. Consequently, the interconnection resistance cannot be reduced sufficiently. On the other hand, the configuration in which the S1 electrode upper interconnects 50a and the S2 electrode upper interconnects 50b which do not depend on the width of the unit are formed above the interconnects whose widths depend on the width of the transistor unit enables a considerable reduction of the interconnection resistance of the device. In addition, forming the S1 electrode upper interconnects 50a, the S2 electrode upper interconnects 50b, the S1 electrode pad 51a, and the S2 electrode pad 51b in an identical layer enables the device to have small on-resistance and a sufficient maximum current with a small number of layers including interconnects. Furthermore, the electrode pads provided above the active region can reduce a chip area of the device.

According to the second embodiment of the present disclosure, a nitride semiconductor device with a double-gate structure of which the on-resistance is reduced and the maximum current per gate width is large can be obtained.

As described above, the nitride semiconductor device of the present disclosure has reduced on-resistance and an increased maximum current. The present disclosure is thus useful in particular for nitride semiconductor devices having electrode pads provided above an active region.

What is claimed is:

1. A nitride semiconductor device, comprising:
a substrate;
a nitride semiconductor layer formed over the substrate and including an active region;
first electrode interconnect layers extending in parallel with one another over the active region of the nitride semiconductor layer and divided by areas extending on the nitride semiconductor layer across a longitudinal direction of the first electrode interconnect layers;
first gate electrodes extending along the first electrode interconnect layers on the nitride semiconductor layer;
first gate electrode connecting interconnects extending in associated ones of the areas dividing the first electrode interconnect layers and perpendicularly to a longitudinal direction of the first gate electrodes, and being in electrical connection to the first gate electrodes;
first electrode connecting interconnects formed above the first gate electrode connecting interconnects and being in electrical connection to the first electrode interconnect layers;
an interconnect insulating film formed over the first electrode interconnect layers and the first electrode connecting interconnects, and having openings, the first electrode connecting interconnects exposed through associated ones of the openings; and
first electrode upper interconnects formed on the first electrode connecting interconnects with the interconnect insulating film interposed therebetween, and being in electrical connection to the first electrode connecting interconnects through the associated ones of the openings.

2. The nitride semiconductor device of claim 1, further comprising:
second electrode interconnect layers extending between and along the first electrode interconnect layers over the active region of the nitride semiconductor layer, and divided by the areas extending across a longitudinal direction of the second electrode interconnect layers;
second electrode connecting interconnects being in electrical connection to the second electrode interconnect layers and formed in associated ones of the areas, the associated ones dividing the first and second electrode interconnect layers and being devoid of the first gate electrode connecting interconnects; and
second electrode upper interconnects formed on the second electrode connecting interconnects with the interconnect insulating film interposed therebetween, wherein
the second electrode connecting interconnects are also exposed through associated ones of the openings of the interconnect insulating film, and
the second electrode connecting interconnects are in electrical connection to the second electrode upper interconnects through the associated ones of the openings of the interconnect insulating film.

3. The nitride semiconductor device of claim 1, wherein
the first electrode interconnect layers are also exposed through the associated ones of the openings of the interconnect insulating film, and
the first electrode upper interconnects are in electrical connection to the first electrode interconnect layers through the associated ones of the openings of the interconnect insulating film.

4. The nitride semiconductor device of claim 2, wherein
the second electrode interconnect layers are also exposed through the associated ones of the openings of the interconnect insulating film, and
the second electrode upper interconnects are in electrical connection to the second electrode interconnect layers through the associated ones of the openings of the interconnect insulating film.

5. The nitride semiconductor device of claim 2, wherein
the first electrode interconnect layers include first electrodes formed directly on the nitride semiconductor layer and first electrode interconnects formed on the first electrodes,
an electrode insulating film covering the first gate electrodes and the first gate electrode connecting interconnects and having openings is formed on the nitride semiconductor layer,
the first electrodes are exposed through associated ones of the openings of the electrode insulating film, and
the first electrode interconnects are in electrical connection to the first electrodes through the associated ones of the openings of the electrode insulating film.

6. The nitride semiconductor device of claim 5, wherein
the second electrode interconnect layers include second electrodes formed directly on the nitride semiconductor layer and second electrode interconnects formed on the second electrodes,
the second electrodes are also exposed through associated ones of the openings of the electrode insulating film, and
the second electrode interconnects are in electrical connection to the second electrodes through the associated ones of the openings of the electrode insulating film.

7. The nitride semiconductor device of claim 1, wherein the first gate electrode connecting interconnects have a larger width than the first gate electrodes.

8. The nitride semiconductor device of claim 5, wherein the first electrode connecting interconnects have a larger width than the first electrode interconnects.

9. The nitride semiconductor device of claim 6, wherein the second electrode connecting interconnects have a larger width than the second electrode interconnects.

10. The nitride semiconductor device of claim 2, further comprising:
a first electrode pad located on the interconnect insulating film and above the active region, the first electrode pad being integral with the first electrode upper interconnects; and
a second electrode pad located on the interconnect insulating film and above the active region, the second electrode pad being integral with the second electrode upper interconnects.

11. The nitride semiconductor device of claim 2, further comprising:
second gate electrodes extending along the second electrode interconnect layers on the nitride semiconductor layer; and
second gate electrode connecting interconnects being in electrical connection to the second gate electrodes and extending perpendicularly to a longitudinal direction of the second gate electrodes in associated ones of the areas, the associated ones dividing the first and second electrode interconnect layers and being devoid of the first gate electrode connecting interconnects.

12. The nitride semiconductor device of claim 11, wherein the second gate electrode connecting interconnects have a larger width than the second gate electrodes.

* * * * *